United States Patent [19]

Cowden

[11] 4,391,696
[45] Jul. 5, 1983

[54] METHOD AND APPARATUS FOR HOLDING STYLI

[75] Inventor: James J. Cowden, Indianapolis, Ind.
[73] Assignee: RCA Corporation, New York, N.Y.
[21] Appl. No.: 296,225
[22] Filed: Aug. 25, 1981
[51] Int. Cl.³ .................. C25D 7/00; C25D 17/10
[52] U.S. Cl. .................... 204/297 W; 204/15
[58] Field of Search ............ 204/15, 297 R, 297 W

[56] References Cited
U.S. PATENT DOCUMENTS 3,803,015  4/1974  Andrews ................ 204/297 R
4,032,414  6/1977  Helder et al. ................ 204/15
4,065,378  12/1977  Sauer et al. ............ 204/297 W
4,312,716  1/1982  Maschler et al. ............ 204/15

Primary Examiner—F. Edmundson
Attorney, Agent, or Firm—Birgit E. Morris; Donald S. Cohen; Thomas H. Magee

[57] ABSTRACT

An apparatus for holding a plurality of styli in a high-density configuration during processing comprises a holder having a slot with a closed end disposed adjacent a first surface thereof. The slot has a pair of longitudinal sides parallel to each other and separated by a distance greater than the diameter of a stylus but less than twice the stylus diameter. Attached to the holder at the end of the slot, opposite the closed end, is means for exerting a clamping force against a stylus disposed at one end of a stack of the styli juxtaposed in two rows oriented along the slot. The exerting means is adapted to push the styli toward the closed end of the slot and thereby effectively hold the styli within the slot.

9 Claims, 4 Drawing Figures

METHOD AND APPARATUS FOR HOLDING STYLI

This invention relates to a method and apparatus for holding a plurality of styli in a high-density configuration during processing.

BACKGROUND OF THE INVENTION

Information playback systems frequently utilize a stylus for reading signals from the surface of an information record, typically a plastic disc, that contains stored video and audio information. In some systems, the information record has a fine spiral groove to guide the tip of a stylus that contains a thin electrode. In these systems, the stylus tip is made of diamond, and the electrode is formed by sputtering a metal, typically titanium, onto one of the diamond facets.

In order to reduce manufacturing costs, it is desirable to hold the styli in a high-density configuration during processing, particularly during the metallic sputtering operation. Such an apparatus would also be utilized to hold the styli while being cleaned in an acid bath, and also during several rinsing steps. The present invention provides a novel method and apparatus for holding a plurality of styli in a high-density configuration during processing.

SUMMARY OF THE INVENTION

The present invention comprises an apparatus for holding a plurality of styli in a high-density configuration during processing. The apparatus comprises a U-shaped holder having a slot with a closed end disposed adjacent a first surface thereof. The slot has a pair of longitudinal sides parallel to each other and separated by a distance greater than the diameter of a stylus but less than twice the stylus diameter. Attached to the holder at the end of the slot, opposite the closed end, is means for exerting a clamping force against a stylus disposed at one end of a stack of the styli juxtaposed in two rows oriented along the slot. The exerting means is adapted to push the styli toward the closed end of the slot and thereby effectively hold the styli within the slot.

DETAILED DESCRIPTION OF THE PREFERRED EMBODIMENT

Figure 1:
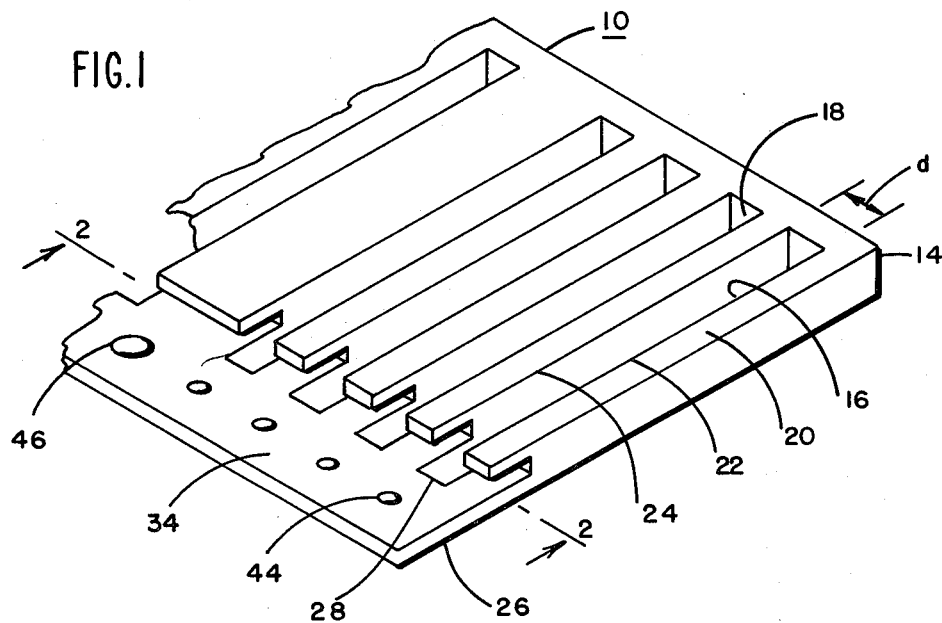
FIG. 1 is a perspective view illustrating one embodiment of the novel stylus-holding apparatus.
Figures 2, 3:
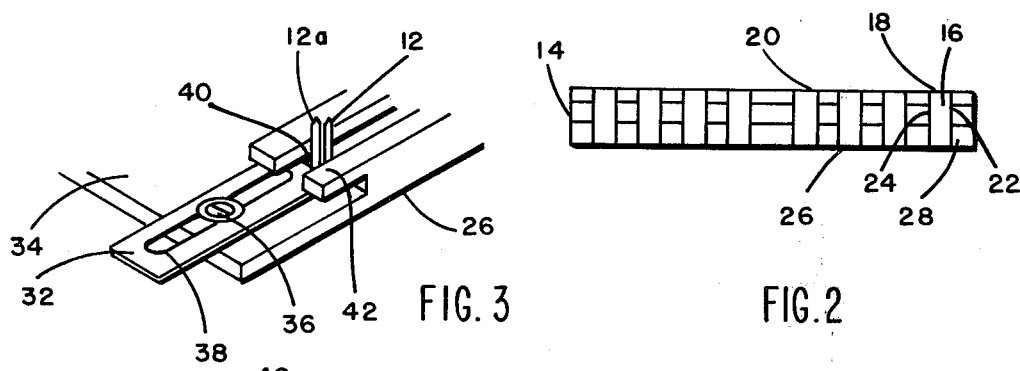
FIG. 2 is a cross-sectional view taken along line 2—2 of FIG. 1.
FIG. 3 is a perspective view of the apparatus shown in FIG. 1 with a plurality of styli being held therein.

In FIGS. 1 through 3 of the drawing, there is shown one embodiment of an apparatus 10 for holding a plurality of styli 12 in a high-density configuration during processing. The apparatus 10 comprises a holder 14 having a slot 16 with a closed end 18 disposed adjacent a first surface 20 thereof. The slot 16 has a pair of longitudinal sides 22 and 24 parallel to each other and separated by a distance d which is greater than the diameter of a stylus 12 but less than twice the stylus diameter. In the present embodiment the slot 16 is substantially U-shaped and extends through the holder 14 to second surface 26 thereof opposite the first surface 20. Preferably, the slot 16 has a width of approximately 0.76 millimeter (0.03 inch), which is suitable for a stylus 12 having a diameter of about 0.51 millimeter (0,02 inch).

The apparatus 10 further comprises means attached to the holder 14 at the end 28 of the slot 16, opposite the closed end 18, for exerting a clamping force against a stylus 12a disposed at the end of a stack of the styli 12 juxtaposed in two rows oriented along the slot 16. The exerting means is adapted to push the styli 12 toward the closed end 18 of the slot 16, and thereby effectively hold the styli 12 within the slot 16. In the present embodiment, the exerting means comprises a rectangular-shaped clamping bar 32 disposed adjacent a third surface 34, as illustrated in FIG. 3. This third surface is disposed at the end 28 of the slot 16, and is parallel to and between the first and second surfaces 20 and 26. The clamping bar 32 is adapted to be held firmly against the holder 14 by a screw 36 extending through an aperture 38 in the bar 32. The aperture 38 is shaped so as to provide a tolerance allowing the bar 32 to be moved along the direction of the slot 16, when the screw 36 is loosened. As shown in FIG. 3, the aperture 38 may be an oblong-shaped oval, and one end 40 of the bar 32 may actually slide beneath an overhanging portion 42 of the holder 14.

Since both the holder 14 and clamping bar 32 may be utilized in an HCl acid bath, it is preferable that they be made of titanium, rather than a metal such as aluminum. In order to maximize the number of styli 12 which may be processed simultaneously, the apparatus 10 may have a plurality of slots 16 disposed adjacent the first surface 20, as shown in FIG. 1, and a plurality of clamping bars 32 for attachment to the holder 14 via holes 44 therein. The holder 14 may also have a separate opening 46 for attaching the holder 14 to a tray (not shown) capable of having several holders 14 mounted thereon.

Figure 4:
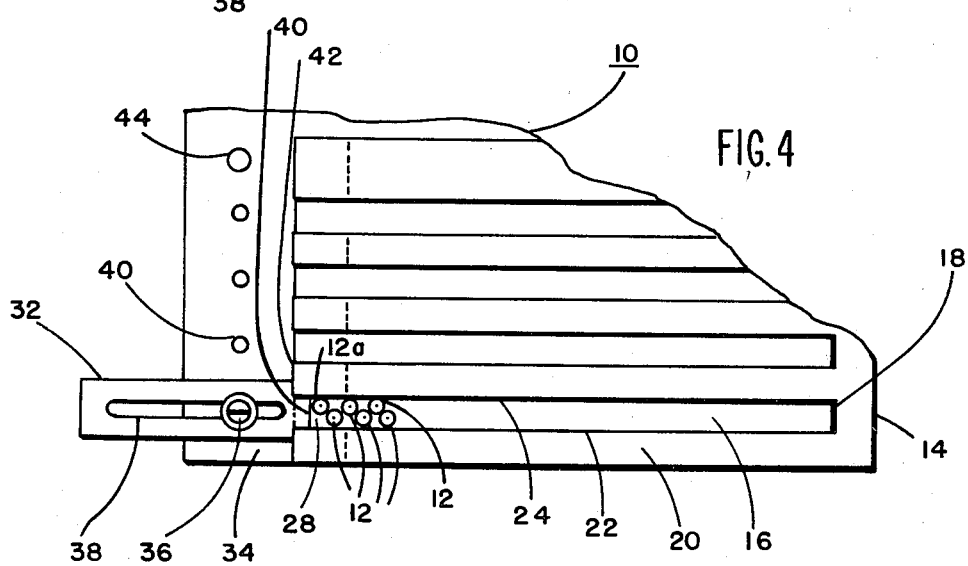
FIG. 4 is a plan view of the apparatus shown in FIG. 3.

The present method of positioning a plurality of the styli 12 in the high-density configuration comprises the first step of stacking the styli 12 in the slot 16 while the holder 14 is held in a slanted orientation with the closed end 18 at the bottom. Since the sides 22 and 24 of the slot 16 are separated by a distance greater than the diameter of a stylus but less than twice the stylus diameter, the styli 12 will stack into two separate rows oriented along the slot 16, as illustrated in FIG. 4.

When the slot 16 is full of styli 12, a clamping force is exerted at the end 28 against the stylus 12a disposed at the end of the stack of styli 12, in a manner such that the styli 12 are pushed toward the closed end 18 of the slot 16 and thereby effectively held within the slot 16. In the present embodiment, this exerting step is performed by holding the rectangular-shaped clamping bar 32 against the end stylus 12a, adjacent the third surface 34 of the holder 14, and by tightening the screw 36 passing through the aperture 38 in the bar 32.

The essence of the present novel invention is that the longitudinal sides 22 and 24 of the slot 16 are separated by a critical distance d which is greater than the stylus diameter but less than twice the stylus diameter. This causes the styli 12 to arrange themselves side-by-side in two rows oriented along the slot 16 in a manner such that a particular stylus does not actually contact the next stylus in the row, but contacts the nearest stylus in the adjacent row. This type of interdigitated arrangement allows the stylus 12a disposed at the end of the stack of styli 12 to extend beyond the last stylus in the adjacent row, and thereby be the only stylus to actually contact the clamping bar 32. Since the bar 32 contacts only the end stylus 12a, which in turn contacts only the nearest stylus in the adjacent row, the clamping force is distributed evenly throughout the entire stack of styli 12, i.e., the two juxtaposed rows, and is thereby able to effectively clamp the entire stack arranged in the high-density configuration. If the slot width d was equal to or greater than twice the stylus diameter, then the clamping bar 32 would not necessarily distribute evenly this clamping force because the bar 32 may contact only one stylus 12a, and this stylus 12a may transmit the clamping force by contacting the next stylus in the same row, thereby preventing some styli 12 in the adjacent row from being effectively held during the processing steps. Since the metallic sputtering step is a relatively expensive operation, by having two rows of styli held closely adjacent each other in the stack, the electrodes are able to be deposited on a larger number of stylus tips in a more economical fashion.

What is claimed is:

1. An apparatus for holding a plurality of styli in a high-density configuration during processing comprising:
    a holder having a slot with a closed end disposed adjacent a first surface thereof, said slot having a pair of longitudinal sides parallel to each other and separated by a distance greater than the diameter of a stylus but less than twice the stylus diameter, said holder having a stack of said styli juxtaposed in two rows oriented along said slot toward said closed end, and
    means attached to said holder at the end of said slot, opposite the closed end, for exerting a clamping force against the stylus disposed at the end of said stack of styli, said exerting means adapted to push said styli toward the closed end of said slot and thereby effectively hold said styli within said slot.

2. An apparatus as defined in claim 1 wherein said slot extends through said holder to a second surface thereof opposite said first surface.

3. An apparatus as defined in claim 2 wherein said slot is substantially U-shaped.

4. An apparatus as defined in claim 3 wherein said exerting means comprises a rectangular-shaped clamping bar disposed adjacent a third surface of said holder, and adapted to be held firmly against said holder by a screw extending through an aperture in said bar, said aperture being shaped so as to provide a tolerance allowing said bar to be moved along the direction of said slot.

5. An apparatus as defined in claim 1 wherein said holder and said exerting means are made of titanium.

6. An apparatus as defined in claim 1 wherein said slot has a width of approximately 0.76 millimeter (0.03 inch).

7. An apparatus as defined in claim 1 wherein said apparatus has a plurality of said slots disposed adjacent said first surface, and a plurality of said exerting means attached to the holder.

8. A method of positioning a plurality of styli in a high-density configuration during processing comprising the steps of:
    stacking said styli in a slot with a closed end disposed adjacent a first surface of a holder, said slot having a pair of longitudinal sides parallel to each other and separated by a distance greater than the diameter of a stylus but less than twice the stylus diameter, said styli being juxtaposed in two rows oriented alond said slot, and
    exerting a clamping force at the end of said slot, opposite the closed end, against the stylus disposed at the end of said stack of styli, in a manner such that said styli are pushed toward the closed end of said slot and thereby effectively held within said slot.

9. A method as recited in claim 8 wherein said exerting step is performed by holding a rectangular-shaped clamping bar adjacent a third surface of said holder utilizing a screw extending through an aperture in said bar, said aperture being shaped so as to provide a tolerance allowing said bar to be moved along the direction of said slot.

* * * * *